US009769968B2

(12) United States Patent
Kakuho et al.

(10) Patent No.: US 9,769,968 B2
(45) Date of Patent: Sep. 19, 2017

(54) ELECTRONIC COMPONENT CONVEYANCE DEVICE

(71) Applicant: MURATA MANUFACTURING CO., LTD., Kyoto-fu (JP)

(72) Inventors: Masaru Kakuho, Nagaokakyo (JP); Naoto Tanaka, Nagaokakyo (JP); Hajime Mitsui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/195,084

(22) Filed: Jun. 28, 2016

(65) Prior Publication Data

US 2017/0001809 A1    Jan. 5, 2017

(30) Foreign Application Priority Data

Jul. 2, 2015  (JP) ................................. 2015-133334

(51) Int. Cl.
| | | |
|---|---|---|
| *B65G 11/08* | (2006.01) | |
| *B65G 47/24* | (2006.01) | |
| *H05K 13/02* | (2006.01) | |
| *B65G 47/248* | (2006.01) | |
| *B65G 54/02* | (2006.01) | |

(52) U.S. Cl.
CPC ......... *H05K 13/022* (2013.01); *B65G 11/081* (2013.01); *B65G 47/248* (2013.01); *H05K 13/028* (2013.01); *B65G 54/02* (2013.01)

(58) Field of Classification Search
CPC ...... B65G 47/24; B65G 47/248; B65G 11/08; B65G 11/081; B65G 11/083; B65G 11/20; B65G 11/203; B65G 11/206; B65G 54/02

USPC ........ 198/619, 398–400, 402–405, 411–412, 198/416–417

See application file for complete search history.

(56) References Cited

U.S. PATENT DOCUMENTS 635,588 A * 10/1899 Pondorf ................ B65G 47/24
                                                    193/47
2,250,427 A * 7/1941 Vannucci ........... B65G 47/1492
                                                    193/46

(Continued)

FOREIGN PATENT DOCUMENTS

| JP | 2011-018698 A | 1/2011 | |
|---|---|---|---|
| KR | 2012-0060802 A | 6/2012 | |
| RU | GB 1280338 A * | 7/1972 | ............ B65G 47/24 |

OTHER PUBLICATIONS

An Office Action; "Notice of Preliminary Rejection," issued by the Korean Patent Office dated Jul. 12, 2017, which corresponds to Korean Patent Application No. 10-2016-0074887 and is related to U.S. Appl. No. 15/195,084; with English language translation.

*Primary Examiner* — Mark A Deuble
(74) *Attorney, Agent, or Firm* — Studebaker & Brackett PC

(57) ABSTRACT

An electronic component conveyance device in which an electronic component is unlikely to jam in a conveyance path. A first magnetic force generation unit is provided lateral to a first sidewall in a midstream part. An interval between the first sidewall and a second sidewall in the midstream part is larger than an interval between the first sidewall and the second sidewall in an upstream part and an interval between the first sidewall and the second sidewall in a downstream part. The first sidewall is flat across the upstream part, the midstream part, and the downstream part.

6 Claims, 3 Drawing Sheets

(56) References Cited

U.S. PATENT DOCUMENTS

| | | | | | |
|---|---|---|---|---|---|
| 3,456,770 | A | * | 7/1969 | Walk | B65G 47/24 |
| | | | | | 193/47 |
| 3,633,729 | A | * | 1/1972 | Reimers | B65G 47/244 |
| | | | | | 198/416 |
| 3,726,387 | A | * | 4/1973 | Krooss | B65G 15/14 |
| | | | | | 198/400 |
| 3,734,268 | A | * | 5/1973 | Burger | B23Q 7/165 |
| | | | | | 198/380 |
| 3,774,782 | A | * | 11/1973 | Lewis, Jr. | B65G 47/24 |
| | | | | | 221/163 |
| 3,876,064 | A | * | 4/1975 | Morton | B65G 47/24 |
| | | | | | 198/381 |
| 3,930,212 | A | * | 12/1975 | Ioffe | B65G 47/24 |
| | | | | | 198/381 |
| 4,136,765 | A | * | 1/1979 | Abraham | B65G 47/24 |
| | | | | | 193/12 |
| 4,308,943 | A | * | 1/1982 | Gierhart | B65G 47/244 |
| | | | | | 193/44 |
| 7,798,308 | B2 | * | 9/2010 | Ranger | B65G 47/2445 |
| | | | | | 198/377.05 |

* cited by examiner

ELECTRONIC COMPONENT CONVEYANCE DEVICE

CROSS REFERENCE TO RELATED APPLICATIONS

This application claims benefit of priority to Japanese Patent Application 2015-133334 filed Jul. 2, 2015, the entire content of which is incorporated herein by reference.

TECHNICAL FIELD

The present disclosure relates to an electronic component conveyance device.

BACKGROUND

A multilayer ceramic capacitor is a known electronic component. The multilayer ceramic capacitor includes a stack of a plurality of internal electrodes and ceramic dielectric layers.

The multilayer ceramic capacitor is typically mounted on a substrate for use. The mechanical strength or floating capacitance of the multilayer ceramic capacitor mounted on the substrate may differ depending on whether the stack direction of the internal electrodes is parallel to or vertical to the surface of the substrate.

In addition, the loudness of acoustic noise may differ depending on whether the stack direction of the internal electrodes is parallel to or vertical to the surface of the substrate. The "acoustic noise" is sound generated by oscillation of the substrate caused by distortion of the multilayer ceramic capacitor due to variation in applied voltage.

For these reasons, the multilayer ceramic capacitor is desirably mounted on the substrate with the stack direction of the internal electrodes being aligned in a predetermined direction.

JP 2011-018698 A discloses an exemplary electronic component conveyance device that aligns the multilayer ceramic capacitor in the predetermined direction. The conveyance device disclosed in JP 2011-018698 A includes a first conveyance path, a rotation path, and a second conveyance path. The rotation path is provided with a first magnet to apply magnetic force to an electronic component so that internal electrodes of the electronic component are aligned in a predetermined direction. The rotation path includes transition guide walls having an interval therebetween that gradually decreases toward an end connected with the second conveyance path.

SUMMARY

In the electronic component conveyance device disclosed in JP 2011-018698 A, the orientation of the electronic component passing through the rotation path becomes tilted, which is likely to cause jamming of the electronic component.

A main object of the present disclosure is to provide an electronic component conveyance device that is unlikely to cause jamming of an electronic component in a conveyance path.

An electronic component conveyance device according to the present disclosure includes a conveyance path and a first magnetic force generation unit. The conveyance path includes an upstream part, a midstream part connected with the upstream part, and a downstream part connected with the midstream part. The conveyance path includes a bottom face, a first sidewall, and a second sidewall defining the upstream part, the midstream part, and the downstream part. The first sidewall and the second sidewall face each other at an interval. The first magnetic force generation unit is provided lateral to the first sidewall in the midstream part. An interval between the first sidewall and the second sidewall in the midstream part is larger than an interval between the first sidewall and the second sidewall in the upstream part and than an interval between the first sidewall and the second sidewall in the downstream part. The first sidewall is flat across the upstream part, the midstream part, and the downstream part. In this configuration, an electronic component rotates while being in contact with the first sidewall, so that a length direction of the electronic component is unlikely to become tilted with respect to a conveyance direction. Accordingly, the electronic component is unlikely to jam in the midstream part.

In the electronic component conveyance device according to the present disclosure, it is preferable that the midstream part includes a transition part connected with the downstream part, the second sidewall is tilted with respect to the conveyance direction in the transition part, and an interval between the first sidewall and the second sidewall is smaller at a position closer to the downstream part. This configuration can more effectively reduce jamming of the electronic component in the midstream part.

It is preferable that the electronic component conveyance device according to the present disclosure further includes a second magnetic force generation unit provided lateral to the second sidewall in the midstream part and arranged at a farther downstream side than the first magnetic force generation unit, and magnetic force generated by the second magnetic force generation unit is weaker than magnetic force generated by the first magnetic force generation unit.

In the electronic component conveyance device according to the present disclosure, it is preferable that in a width direction orthogonal to the conveyance direction, the first magnetic force generation unit does not overlap with other magnetic force generation units including the second magnetic force generation unit, and the second magnetic force generation unit does not overlap with other magnetic force generation units including the first magnetic force generation unit. This configuration facilitates rotation of the electronic component.

In the electronic component conveyance device according to the present disclosure, the first magnetic force generation unit may include one of a permanent magnet and an electromagnet.

In the electronic component conveyance device according to the present disclosure, the conveyance path may convey a rectangular parallelepiped electronic component in a length direction of the electronic component, the electronic component including a plurality of stacked internal conductors.

The present disclosure can provide an electronic component conveyance device in which an electronic component is unlikely to jam in a conveyance path.

DETAILED DESCRIPTION

Figure 1:
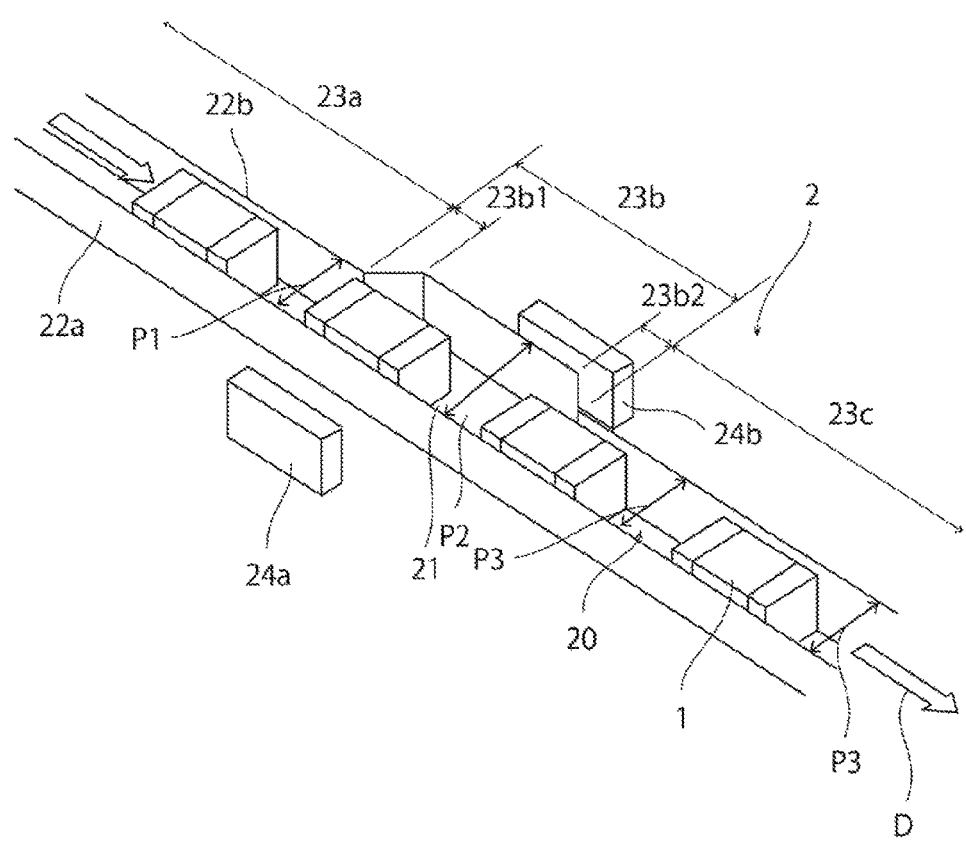
FIG. 1 is a schematic perspective view of a main part of an electronic component conveyance device according to an embodiment of the present disclosure.

Exemplary preferred embodiments of the present disclosure will be described below. The following embodiments, however, are merely examples. The present disclosure is not limited by the following embodiments.

In the accompanying drawings referred to in the embodiments and the like, members having substantially identical functions are denoted by an identical reference numeral. The drawings referred to in the embodiments and the like are schematically illustrated. The dimension, the ratio, and other parameters of an object illustrated in the drawings may be different from those of the object in reality. The dimension, the ratio, and other parameters of the object may be also different between the drawings. Specific values of the dimension, the ratio, and other parameters of the object should be determined according to the following description.

Figure 2:
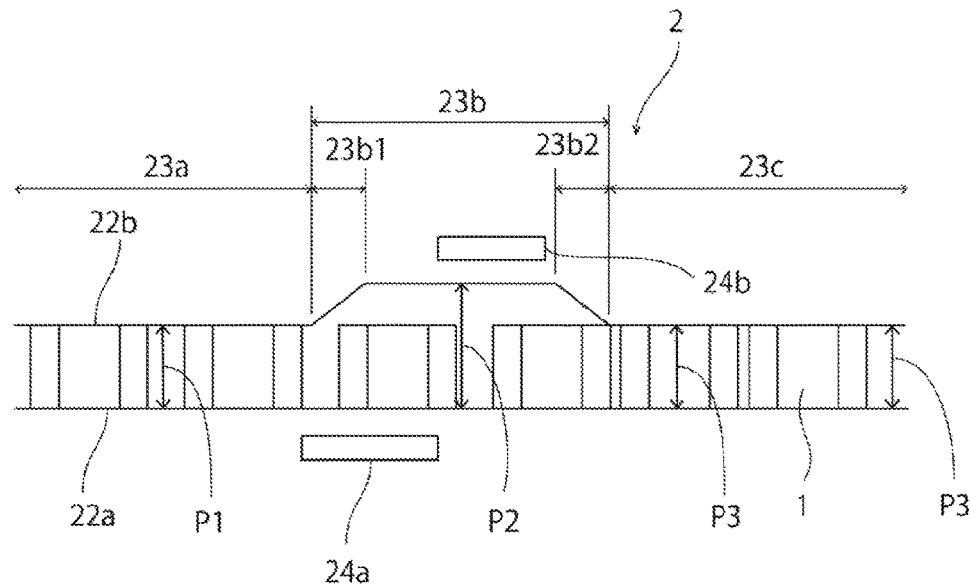
FIG. 2 is a schematic plan view of the main part of the electronic component conveyance device according to the embodiment of the present disclosure.

FIG. 1 is a schematic perspective view of a main part of an electronic component conveyance device according to the present embodiment. FIG. 2 is a schematic plan view of the main part of the electronic component conveyance device according to the present embodiment. The electronic component conveyance device 2 illustrated in FIGS. 1 and 2 conveys an electronic component 1. The electronic component 1 thus conveyed may be any rectangular parallelepiped.

Figure 3:
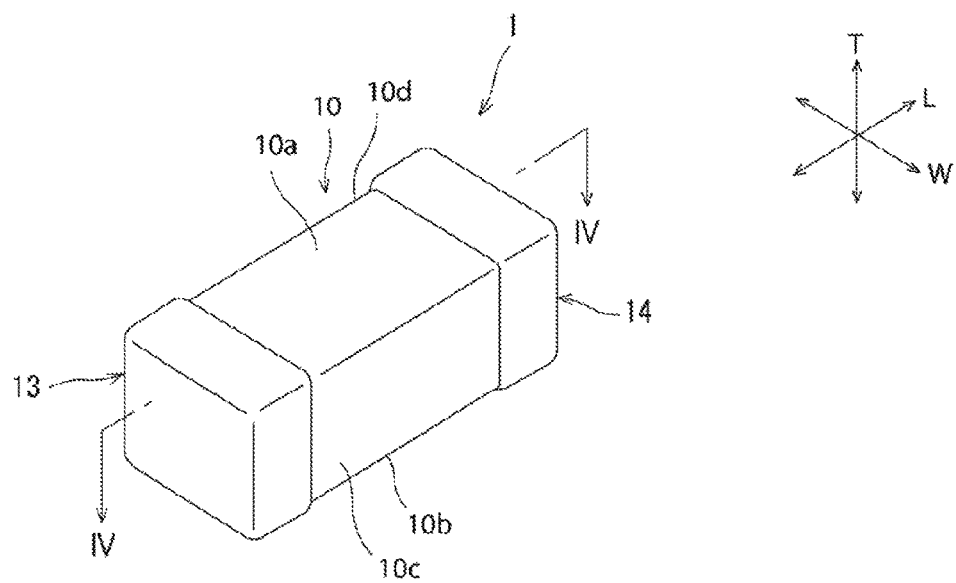
FIG. 3 is a schematic perspective view of an electronic component conveyed in the embodiment of the present disclosure.
Figure 4:
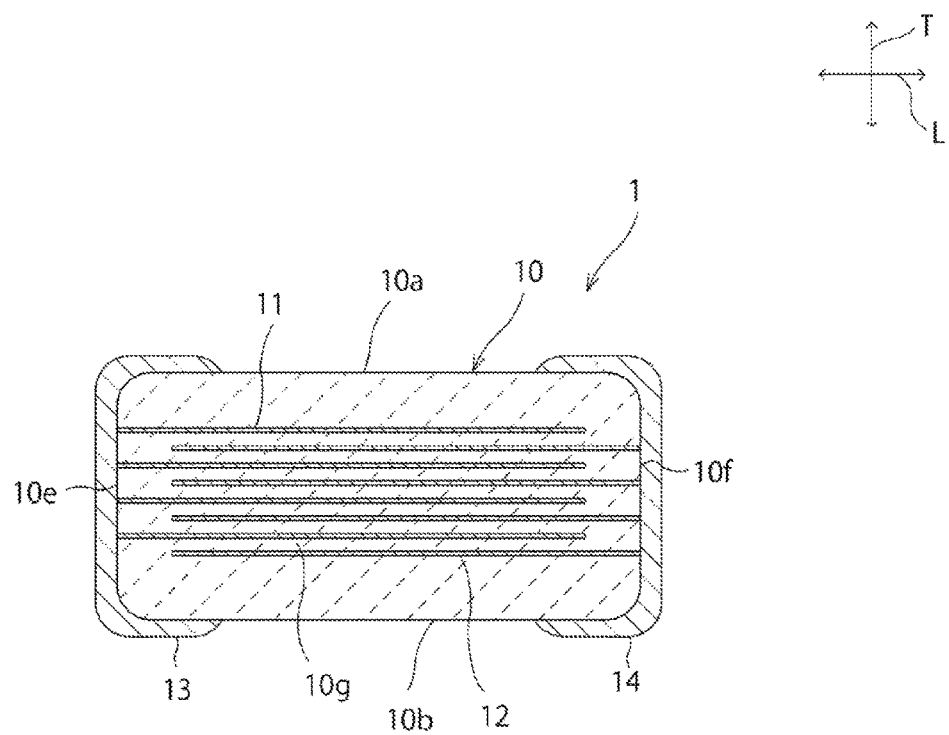
FIG. 4 is a schematic sectional view taken along line IV-IV in FIG. 3.

Specifically, the present embodiment describes an example in which the electronic component 1 illustrated in FIGS. 3 and 4 is conveyed by the electronic component conveyance device 2.

FIG. 3 is a schematic perspective view of the electronic component 1 conveyed in the present embodiment. FIG. 4 is a schematic sectional view taken along line IV-IV in FIG. 3.

The electronic component 1 illustrated in FIGS. 3 and 4 is a rectangular parallelepiped capacitor. Specifically, the electronic component 1 is a rectangular parallelepiped multilayer ceramic capacitor. The present disclosure is suitable for the electronic component 1 including a large capacitance that is likely to generate acoustic noise, especially for the electronic component 1 having a capacitance of 1 µF or larger or a capacitance of 10 µF or larger.

In the present disclosure, the electronic component is not limited to a capacitor. In the present disclosure, the electronic component may be a thermistor or an inductor, for example.

The electronic component 1 includes an electronic component body 10. The electronic component body 10 has a substantially rectangular parallelepiped shape. This substantially rectangular parallelepiped shape includes, in addition to a rectangular parallelepiped shape, the shape of a rectangular parallelepiped with rounded corners and edges.

The electronic component body 10 has a first main face 10a and a second main face 10b, a first side face 10c and a second side face 10d, and a first end face 10e and a second end face 10f (refer to FIG. 4). The first and second main faces 10a and 10b each extend in a length direction L and a width direction W. The length direction L and the width direction W are orthogonal to each other. The first and second side faces 10c and 10d each extend in the length direction L and a thickness direction T. The thickness direction T is orthogonal to the length direction L and the width direction W. The first and second end faces 10e and 10f each extend in the width direction W and the thickness direction T.

The dimension of the electronic component body 10 in the length direction L is larger than that in the width direction W and the thickness direction T. The dimension of the electronic component body 10 in the width direction W is substantially equal to the dimension of the electronic component body 10 in the thickness direction T. Specifically, the dimension of the electronic component body 10 in the width direction W is between 0.8 and 1.2 (inclusive) times as large as the dimension of the electronic component body 10 in the thickness direction T.

Specifically, in the present embodiment, the dimension of the electronic component body 10 in the length direction L is preferably equal to or larger than 0.6 mm and equal to or smaller than 2.0 mm so as to facilitate rotation of the electronic component 1 by magnetic force. The dimension of the electronic component body 10 in the width direction W is preferably between 0.3 mm and 1.0 mm inclusive. The dimension of the electronic component body 10 in the thickness direction T is preferably between 0.3 mm and 1.0 mm inclusive.

The electronic component body 10 is made of ferroelectric ceramics to obtain a large capacitance. Specifically, examples of the dielectric ceramics include $BaTiO_3$, $CaTiO_3$, and $SrTiO_3$. To the electronic component body 10 may be added accessory components such as a Mn compound, a Mg compound, a Si compound, a Fe compound, a Cr compound, a Co compound, a Ni compound, and a rare earth compound, as appropriate, in response to characteristics required for the electronic component 1. The ferroelectric ceramics preferably has a relative permittivity of 2000 or larger, and more preferably has a relative permittivity of 3000 or larger. In this case, the capacitances of 1 µF or larger and 10 µF or larger can be achieved with the above-described dimension range of the electronic component body 10. The present disclosure is suitably applicable to the electronic component 1 that is likely to generate acoustic noise.

As illustrated in FIG. 4, a plurality of first internal electrodes 11 and a plurality of second internal electrodes 12 are provided as internal conductors inside the electronic component body 10.

The first internal electrodes 11 and the second internal electrodes 12 are alternately stacked in the thickness direction T, and face towards each other in the thickness direction T with a ceramic part 10g interposed therebetween. To increase the number of the internal electrodes 11 and 12, the ceramic part 10g preferably has a thickness of 1 µm or smaller. A too small thickness of the ceramic part 10g, however, may lead to a low voltage-proof characteristic. For this reason, the ceramic part 10g preferably has a thickness of 0.3 µm or larger. The total number of the internal electrodes 11 and 12 is preferably 350 or larger.

The first internal electrodes 11 are provided in the length direction L and the width direction W. The first internal electrodes 11 are extended to the first end face 10e. The first internal electrodes 11 are not extended to the first and second main faces 10a and 10b, the first and second side faces 10c and 10d, and the second end face 10f.

The second internal electrodes 12 are provided in the length direction L and the width direction W. The second internal electrodes 12 are extended to the second end face 10f. The second internal electrodes 12 are not extended to the first and second main faces 10a and 10b, the first and second side faces 10c and 10d, and the first end face 10e.

The first and second internal electrodes 11 and 12 each contain metal, especially ferromagnetic metal. Specifically, examples of ferromagnetic metal preferably used include an alloy containing at least one of Ni, Fe, Ni, and Fe.

The first end face 10e is provided with a first external electrode 13. The first external electrode 13 extends from the first end face 10e to part of the first and second main faces 10a and 10b and part of the first and second side faces 10c and 10d. The first external electrode 13 is connected with the first internal electrodes 11 at the first end face 10e.

The second end face 10f is provided with a second external electrode 14. The second external electrode 14 extends from the second end face 10f to part of the first and second main faces 10a and 10b and part of the first and second side faces 10c and 10d. The second external electrode 14 is connected with the second internal electrodes 12 at the second end face 10f.

The first and second external electrodes 13 and 14 each contain at least one of Pt, Au, Ag, Cu, Ni, and Cr, for example.

The following describes the electronic component conveyance device 2 in detail with reference to FIGS. 1 and 2.

Figure 5:
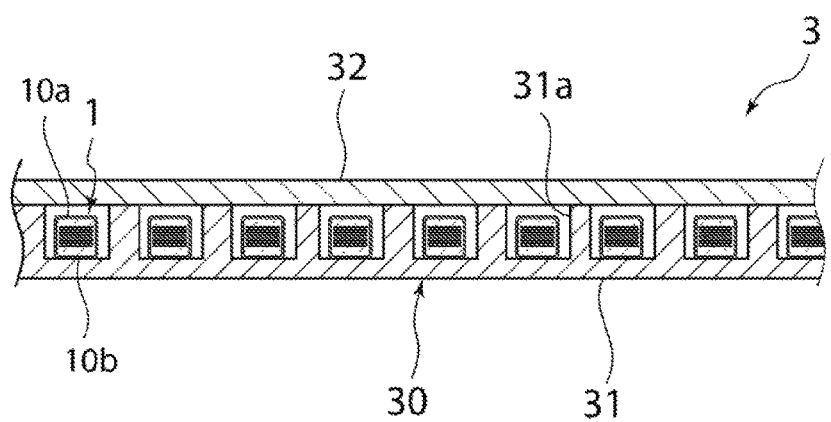
FIG. 5 is a schematic sectional view of a taping electronic component array manufactured in the embodiment of the present disclosure.

The electronic component conveyance device 2 includes a conveyance path 20. The conveyance path 20 is connected with a housing unit (not illustrated) that houses a plurality of electronic components 1. The housing unit supplies each electronic component 1 onto the conveyance path 20. The electronic component 1 conveyed in the conveyance path 20 is inserted, by an inserting unit not illustrated, into each of a plurality of recesses 31a provided separately from each other in an elongate carrier tape 31 illustrated in FIG. 5. Thereafter, a cover tape 32 is placed on the carrier tape 31. Thus, a taping electronic component array 3 is manufactured that includes a tape 30 including the carrier tape 31 and the cover tape 32, and the electronic components 1 housed in the recesses 31a.

As illustrated in FIGS. 1 and 2, the electronic components 1 are conveyed in the length direction L in the conveyance path 20.

The conveyance path 20 has a bottom face 21, a first sidewall 22a, and a second sidewall 22b. The bottom face 21 is horizontally provided. The first sidewall 22a extends upwardly from one side edge of the bottom face 21 in the width direction thereof. The first sidewall 22a is vertical to the bottom face 21. The second sidewall 22b extends upwardly from the other side edge of the bottom face 21 in the width direction thereof. The second sidewall 22b is vertical to the bottom face 21.

The conveyance path 20 has an upstream part 23a, a midstream part 23b, and a downstream part 23c. The upstream part 23a, the midstream part 23b, and the downstream part 23c are provided in this order from the housing unit (upstream) toward the inserting unit (downstream). The bottom face 21, the first sidewall 22a, and the second sidewall 22b extend through the upstream part 23a, the midstream part 23b, and the downstream part 23c.

In the upstream part 23a and the downstream part 23c, the first sidewall 22a and the second sidewall 22b are provided at such an interval therebetween that the electronic component 1 is not rotatable about the length direction L. In other words, when the electronic component 1 has a dimension W1 in the width direction W and a dimension T1 in the thickness direction T, intervals P1 and P3 between the first sidewall 22a and the second sidewall 22b in the upstream part 23a and the downstream part 23c, respectively, are larger than W1 and T1 and smaller than $\{(W1)^2+(T1)^2\}^{1/2}$.

An interval P2 between the first sidewall 22a and the second sidewall 22b in the midstream part 23b is larger than the intervals P1 and P3 between the first sidewall 22a and the second sidewall 22b in the upstream part 23a and the downstream part 23c, respectively. Specifically, in the midstream part 23b, the first sidewall 22a and the second sidewall 22b are provided at such an interval therebetween that the electronic component 1 is rotatable about the length direction L. In other words, the interval P2 between the first sidewall 22a and the second sidewall 22b in the midstream part 23b is larger than $\{(W1)^2+(T1)^2\}^{1/2}$.

The midstream part 23b includes a first transition part 23b1 connected with the upstream part 23a. In the first transition part 23b1, the second sidewall 22b is tilted with respect to a conveyance direction D. The first sidewall 22a is parallel to the conveyance direction D and is a flat (plane) in the upstream part 23a and the midstream part 23b. Thus, in the first transition part 23b1, the first sidewall 22a and the second sidewall 22b have an interval therebetween that gradually increases further away from the upstream part 23a.

The midstream part 23b includes a second transition part 23b2 connected with the downstream part 23c. In the second transition part 23b2, the second sidewall 22b is tilted with respect to the conveyance direction D. The first sidewall 22a is parallel to the conveyance direction D and is a flat (plane) in the midstream part 23b and the downstream part 23c. Thus, in the second transition part 23b2, the first sidewall 22a and the second sidewall 22b have an interval therebetween that gradually decreases closer to the downstream part 23c.

The electronic component conveyance device 2 includes a first magnetic force generation unit 24a and a second magnetic force generation unit 24b. In the present disclosure, however, the electronic component conveyance device may include the first magnetic force generation unit only.

The first magnetic force generation unit 24a and the second magnetic force generation unit 24b each generate magnetic force. The first magnetic force generation unit 24a and the second magnetic force generation unit 24b may each include a permanent magnet or an electromagnet, for example.

The first magnetic force generation unit 24a is provided lateral to the first sidewall 22a. In the midstream part 23b, the first magnetic force generation unit 24a applies magnetic force to the electronic component 1 so that the stack direction of the plurality of internal electrodes (internal conductors) 11 and 12 in the electronic component 1 (hereinafter simply referred to as a "stack direction of the electronic component 1") is aligned with a predetermined direction (a predetermined desirable constant direction, the horizontal direction, or the vertical direction). Specifically, when the electronic component 1 of which the stack direction is aligned with the predetermined direction is conveyed from the upstream part 23a, even if the first magnetic force generation unit 24a applies magnetic force to the electronic component 1, the stack direction of the electronic component 1 does not change (rotate). In contrast, when the electronic component 1 of which the stack direction intersects with the predetermined direction is conveyed from the upstream part 23a, the magnetic force by the first magnetic force generation unit 24a is applied to the electronic component 1, so that the electronic component 1 rotates about an axis extending in the length direction L. As a result, the stack direction of the electronic component 1 becomes aligned with the predetermined direction. Accordingly, the electronic component 1 is conveyed in the downstream part 23c with its stack direction being aligned with the predetermined direction. This is a process performed in the midstream part 23b to align the stack direction of the electronic component 1. The electronic component 1 of which the stack direction is aligned is then conveyed to the downstream part 23c.

The second magnetic force generation unit 24b is provided lateral to the second sidewall 22b in the midstream part 23b and downstream of the first magnetic force generation unit 24a. Magnetic force generated by the second magnetic force generation unit 24b is weaker than the magnetic force generated by the first magnetic force generation unit 24a. When the second magnetic force generation unit 24b is provided in this arrangement, the attractive force applied by the second magnetic force generation unit 24b facilitates separation of the electronic component 1 passing by the first magnetic force generation unit 24a off the first sidewall 22a, and thus rotation of the electronic component 1. In order to facilitate rotation of the electronic component 1 in this manner, the first magnetic force generation unit 24a and the second magnetic force generation unit 24b are preferably not opposite to each other, in other words, do not overlap with each other in a width direction orthogonal to the conveyance direction D. Specifically, the first magnetic force generation unit 24a preferably does not overlap with other magnetic force generation units including the second magnetic force generation unit 24b, and the second magnetic force generation unit 24b preferably does not overlap with other magnetic force generation units including the first magnetic force generation unit 24a.

When the first sidewall and the second sidewall are both tilted with respect to the conveyance direction D as disclosed in JP 2011-018698 A, the electronic component jams in the midstream part in some cases. As a result of intensive research, the inventors have found that this is because, when the electronic component 1 in contact with a sidewall while being attracted by a magnetic force generation unit passes by a tilted part of the sidewall, the length direction of the electronic component 1 becomes misaligned with the conveyance direction D so that the electronic component 1 starts to rotate.

In the electronic component conveyance device 2, the electronic component 1 becomes attracted toward the first sidewall 22a by the first magnetic force generation unit 24a. In the present embodiment, the first sidewall 22a is planar (flat). More specifically, the first sidewall 22a is planar from the upstream part 23a to the downstream part 23c. The first sidewall 22a has neither a level difference portion nor a tilted portion between the upstream part 23a and the downstream part 23c. In this configuration, the electronic component 1 rotates about the length direction L while any of the first and second main faces 10a and 10b and the first and second side faces 10c and 10d of the electronic component 1 is in contact with the planar first sidewall 22a parallel to the conveyance direction D. Accordingly, the length direction L is unlikely to become tilted with respect to the conveyance direction D when the electronic component 1 rotates. As a result, the rotated electronic component 1 is unlikely to jam in the midstream part 23b.

To more effectively reduce jamming of the rotated electronic component 1 in the midstream part 23b, the second sidewall 22b is preferably tilted with respect to the conveyance direction D such that an interval between the first sidewall 22a and the second sidewall 22b gradually decreases in the first transition part 23b1.

The inventors conducted an experiment that the electronic component conveyance device 2 conveyed an electronic component having a dimension of 1.0 mm×0.5 mm×0.5 mm and a capacitance of 2.2 µF at a speed of 8000 per minutes or lower, and found that no jamming of the electronic component occurred. However, with a configuration in which the first sidewall and the second sidewall are both provided outside thereof in the midstream part to have a wider midstream part, the jamming of the electronic component occurred.

What is claimed is:

1. An electronic component conveyance device comprising:
   a conveyance path; and
   a first magnetic force generation unit,
   the conveyance path including an upstream part, a midstream part connected with the upstream part, and a downstream part connected with the midstream part,
   the conveyance path including a bottom face, a first sidewall, and a second sidewall defining the upstream part, the midstream part, and the downstream part,
   the first sidewall and the second sidewall facing each other at an interval,
   the first magnetic force generation unit being provided lateral to the first sidewall in the midstream part,
   an interval between the first sidewall and the second sidewall in the midstream part being larger than an interval between the first sidewall and the second sidewall in the upstream part and larger than an interval between the first sidewall and the second sidewall in the downstream part, and
   the first sidewall being continuously flat across the upstream part, the midstream part, and the downstream part,
   wherein the first magnetic generation unit applies magnetic force to a rectangular parallelepiped electronic component including a plurality of stacked internal conductors so that the electronic component can rotate about an axis extending in a length direction of the electronic component.

2. The electronic component conveyance device according to claim 1, wherein
   the midstream part includes a transition part connected with the downstream part, and
   in the transition part, the second sidewall is tilted with respect to a conveyance direction and an interval between the first sidewall and the second sidewall is smaller at a position closer to the downstream part.

3. The electronic component conveyance device according claim 1, further comprising a second magnetic force generation unit provided lateral to the second sidewall in the midstream part and arranged at a farther downstream side than the first magnetic force generation unit,
   wherein magnetic force generated by the second magnetic force generation unit is weaker than magnetic force generated by the first magnetic force generation unit.

4. The electronic component conveyance device according to claim 1, further comprising a second magnetic force generation unit provided lateral to the second sidewall in the midstream part and arranged at a farther downstream side than the first magnetic force generation unit,
   wherein the first magnetic force generation unit does not overlap with other magnetic force generation units including the second magnetic force generation unit in a width direction orthogonal to a conveyance direction, and
   the second magnetic force generation unit does not overlap with other magnetic force generation units including the first magnetic force generation unit.

5. The electronic component conveyance device according to claim 1, wherein the first magnetic force generation unit includes one of a permanent magnet and an electromagnet.

6. The electronic component conveyance device according to claim 1, wherein the conveyance path conveys the electronic component in the length direction of the electronic component.

* * * * *